United States Patent [19]

Perkins

[11] Patent Number: 4,485,348

[45] Date of Patent: Nov. 27, 1984

[54] FULL WAVE ENVELOPE DETECTOR USING CURRENT MIRRORS

[75] Inventor: Geoffrey W. Perkins, Chandler, Ariz.

[73] Assignee: Motorola, Inc., Schaumburg, Ill.

[21] Appl. No.: 383,684

[22] Filed: Jun. 1, 1982

[51] Int. Cl.³ .................. H03D 1/14; H02M 7/217
[52] U.S. Cl. ............................. 329/101; 329/166;
                                                328/26; 363/127
[58] Field of Search .............. 328/26, 150; 307/261,
                 307/356; 329/101, 166, 203, 204, 205 R;
                                                363/127; 455/337

[56] References Cited

U.S. PATENT DOCUMENTS

| 4,041,334 | 8/1977 | Umeda | 328/26 X |
| 4,158,882 | 6/1979 | Citta | 328/26 X |
| 4,336,586 | 6/1982 | Lunn | 329/166 |
| 4,445,054 | 4/1984 | Ishii | 328/26 |

Primary Examiner—Eugene R. Laroche
Assistant Examiner—W. R. Paxman
Attorney, Agent, or Firm—Vincent B. Ingrassia

[57] ABSTRACT

The fullwave bridge envelope detector comprises first, second, third, and fourth rectifier circuits each of which are coupled to receive first or second alternating input signals which are 180 degrees out of phase. The first and third rectifier circuits each include a diode connected transistor and an additional transistor coupled in current mirror relationship therewith so as to produce halfwave rectified versions of the first and second alternating input signals respectively. The second and fourth rectifier circuits each comprise a transistor which is rendered conductive when first and second alternating input signals respectively become negative. The halfwave rectified signals produced by the first and second rectifier circuits and the halfwave rectified signals produced by the third and fourth rectifier circuits are summed at an output node to produce the fullwave rectified version.

5 Claims, 1 Drawing Figure

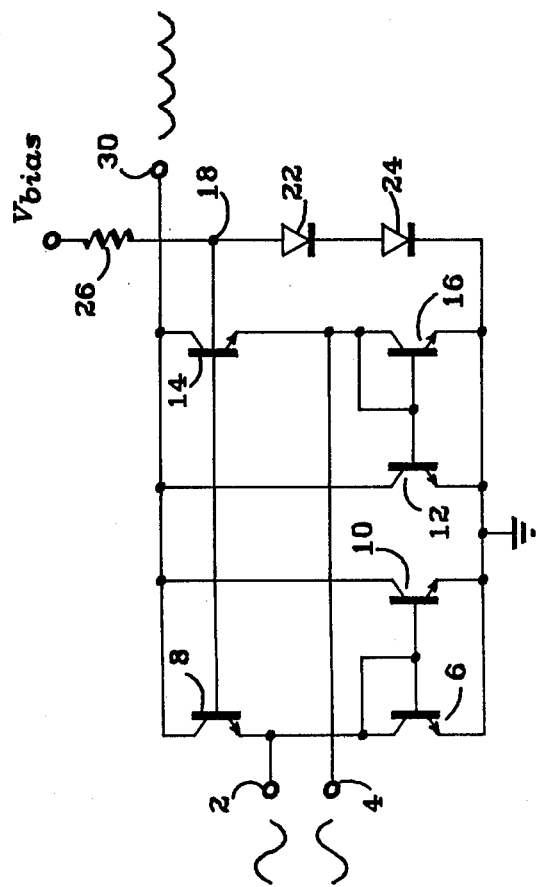

FULL WAVE ENVELOPE DETECTOR USING CURRENT MIRRORS

BACKGROUND OF THE INVENTION

1. Field of the Invention

This invention relates generally to envelope detectors and, more particularly, to a high-gain, high-speed full wave bridge envelope detector suitable for wide band input signal applications and which can be fabricated in monolithic integrated circuit form.

2. Description of the Prior Art

Full wave rectifiers are well known and are used in a variety of applications. For example, full wave rectifiers are commonly used in amplitude demodulation, amplitude measurement systems, and may be utilized for video detection and included as part of the video detector portion of a television receiver to extract the video signal from the television composite carrier signal.

Certain known rectifiers capable of being used in high speed, wide band input signal applications generally require direct current biasing at a quiescent operating point. Unfortunately, this may cause the full wave rectifier to exhibit a non-linear transfer characteristic. Another problem associated with certain prior art devices which were utilized, for example, as video detectors in a television receiver, resides in the fact that a tuned circuit at the television carrier frequency is required. This tuned circuit may cause phase related problems in a television receiver as well as spurious feedback to the high sensitivity input terminals. Furthermore, the tuned circuit requires additional external terminals.

The circuit described in U.S. patent application Ser. No. 220,329 filed Dec. 29, 1980, now U.S. Pat. No. 4,336,586, entitled "Linear Full Wave Rectifier Circuit" and assigned to the assignee of the present invention represents a solution to the above identified problems; i.e. the circuit produces a nearly perfect full wave rectified version of an applied alternating signal. The circuit comprises first and second identical non-linear symmetrical rectifiers each having a respective output coupled to a current mirror circuit. In response to the alternating signal being applied to the input of the first rectifier, a full wave rectified signal is produced at the output thereof for driving the current mirror. The output of the current mirror, which is coupled to the output of a second rectifier, represents a signal identical to the output from the first rectifier. This signal is utilized to produce an input signal to the second rectifer to render the output signal therefrom identical to the output signal from the current mirror circuit. Thus, the input signal to the second rectifier is a perfect full wave rectified version of the input signal applied to the first rectifier.

Unfortunately, a problem exists in generating enough drive at the output of the television system IF amplifier in order to obtain a sufficient output from the rectifier circuit.

SUMMARY OF THE INVENTION

It is an object of the present invention to provide an improved full wave bridge envelope dectector.

It is a further object of the present invention to provide a full wave bridge envelope detector having higher gain without having a major impact on the amount of semiconductor area consumed.

It is still further object of the present invention to provide a full wave bridge envelope detector for use in a television system which will provide a higher gain output with a reduced drive from its preceding IF amplifier.

According to a broad aspect of the invention there is provided a full wave bridge envelope detector, comprising: first rectifier means adapted to receive a first alternating inut signal for producing a first half-wave rectified version of said first alternating input signal; second rectifier means coupled to said first rectifier means and adapted to receive a second alternating input signal for producing a second half-wave rectified version of said second alternating input signal, said first alternating input signal being 180 degrees out of phase with said second alternating input signal; first means for substantially doubling the amplitude of said first and second half-wave rectified versions; and second means for summing said first and second versions after doubling to produce an output indicative of said envelope at an output node.

BRIEF DESCRIPTION OF THE DRAWING

The above and other objects features and advantages of the present invention will be more clearly understood from the following detailed description taken in conjunction with the accompanying drawing which is a schematic diagram of the inventive full wave bridge envelope detector.

DESCRIPTION OF THE PREFERRED EMBODIMENT

The full wave bridge envelope detector shown in the drawing comprises transistors 6, 8, 10, 12, 14, and 16, diodes 22 and 24 coupled in series between a source of supply voltage (in this case ground) and the base of transistors 8 and 14, and resistor 26. Each of transistors 8, 10, 12, and 14 have their collector terminals coupled to a summing node 30. Transistors 6 and 16 are each coupled as diodes with their base and collector terminals coupled together. The emitter terminals of transistors 6, 10, 12, and 16 are coupled to the source of supply (ground) and the collectors of transistors 6 and 16 are coupled respectively to the emitters of transistors 8 and 14. The base of transistor 6 is coupled to the base of transistor 10, and the base of transistor 12 is coupled to the base of transistor 16. The base terminals of transistors 8 and 14 are coupled to node 18 at which a DC bias is provided by serially coupled diodes (22 and 24) and resistor 26 coupled to a source of bias voltage $V_{BIAS}$. Diodes 22 and 24 may be implemented by diode connected transistors as is well known in the art.

The remainder of the circuit operates as follows. First and second alternating signals 180 degrees out of phase with each other are applied to input terminals 2 and 4. When the voltage at terminal 2 goes positive, diode connected transistor 6 becomes forward biased and begins to draw current, and transistor 8 is cut off. The current flowing through diode 6 is mirrored in transistor 10 causing the voltage at its collector (summing node 30) to fall. Thus, transistors 6 and 10 act as a first halfwave rectifying means.

When the signal appearing at terminal 2 is positive, the signal appearing at terminal 4 is negative. The negative signal renders transistor 14 conductive to produce a halfwave rectified version at the collector of transistor 14. Thus, transistor 14 acts as a second halfwave rectifying means. The signal changes due to the conduction of current through transistors 10 and 14 are summed at terminal 30. Thus, the amplitude of the envelope signal has been effectively doubled.

When the signal at terminal 2 goes negative and the signal at terminal 4 goes positive, transistor 8 is rendered conductive to produce a second halfwave rectified version of the signal appearing at terminal 2. Furthermore, transistor 14 is cut off, and diode connected transistor 16 conducts current which is mirrored at the collector of transistor 12 to produce a second rectified version. Thus, transistors 12 and 16 and transistor 8 act as first and second halfwave rectifiers. Again, the signal changes caused by the conduction of current through transistors 8 and 12 are summed at terminal 30.

As a result of additional transistors 10 and 12 and the doubling of the output signal effected thereby, the drive to the circuit can be reduced, and the circuit still provides a sufficient output.

The above description is given by way of example only. Changes in form and details may be made by one skilled in the art without departing from the scope of the invention.

I claim:

1. A full wave bridge envelope detector, comprising:
   first rectifier means receiving a first altenrating input signal for producing a first half-wave rectified version of said first alternating input signal, said first rectifier means including first diode means having an anode for receiving said first alternating input signal and having a cathode for coupling to a first source of supply voltage, and a first transistor having an emitter for coupling to said first source of supply voltage, a collector coupled to an output node and a base coupled to the anode of said first diode means;
   second recitifer means receiving a second alternating input signal, 180 degrees out of phase with said first alternating input signal, for producing a second half-wave rectified version of said first alternating input signal;
   third rectifier means receiving said second alternating input signal and coupled to said second rectifier means for producing a first half-wave rectified version of said second alternating input signal;
   fourth rectifier means coupled to said first rectifier means and receiving said first alternating input signal for producing a second half-wave rectified version of said second alternating input signal; and
   means for summing said first and second half-wave rectified versions of said first alternating input signal and said first and second half-wave rectified versions of said second alternating input signal to produce a fullwave rectified version indicative of said envelope at said output node.

2. An envelope detector according to claim 1 wherein said second rectifier means comprises a second transistor having a base coupled to a source of a bias voltage, a collector coupled to said output node, and an emitter for coupling to said second alternating input signal.

3. An envelope detector according to claim 2 wherein said third rectifier means comprises:
   second diode means having an anode for receiving said second alternating input signal and having a cathode for coupling to said source of supply voltage; and
   a third transistor having an emitter for coupling to said source of supply voltage, a base coupled to said anode and a collector coupled to said output node.

4. An envelope detector according to claim 3 wherein said fourth rectifying means comprises:
   a fourth transistor having a base coupled to said source of a bias voltage, a collector coupled to said output node and an emitter coupled to receive said first alternating input signal.

5. An envelope detector according to claim 4 wherein each of said first and second diode means comprises a diode connected transistor.

* * * * *